US011600509B2

(12) United States Patent
Yen et al.

(10) Patent No.: US 11,600,509 B2
(45) Date of Patent: Mar. 7, 2023

(54) MICRO PICK UP ARRAY AND MANUFACTURING METHOD THEREOF

(71) Applicant: Au Optronics Corporation, Hsinchu (TW)

(72) Inventors: Ze-Yu Yen, Taipei (TW); Yi-Fen Lan, Taichung (TW); Ho-Cheng Lee, Kaohsiung (TW); Tsung-Tien Wu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 1185 days.

(21) Appl. No.: 16/154,733

(22) Filed: Oct. 9, 2018

(65) Prior Publication Data

US 2019/0115242 A1    Apr. 18, 2019

(30) Foreign Application Priority Data

Oct. 18, 2017 (TW) .................................. 106135572

(51) Int. Cl.
*H01L 21/68* (2006.01)
*H01L 21/683* (2006.01)
*H01L 21/768* (2006.01)
*B81C 99/00* (2010.01)
*H01L 21/67* (2006.01)
*B81C 1/00* (2006.01)

(52) U.S. Cl.
CPC ...... *H01L 21/6833* (2013.01); *B81C 1/00111* (2013.01); *B81C 99/002* (2013.01); *H01L 21/67144* (2013.01); *H01L 21/76877* (2013.01); *B81B 2207/056* (2013.01); *H01L 21/68* (2013.01)

(58) Field of Classification Search
CPC ............... B81C 1/00111; B81C 99/002; H01L 21/6833; H01L 21/67144; H01L 21/76877; H01L 21/68; B81B 2207/056
USPC .......................................................... 414/800
See application file for complete search history.

(56) References Cited

U.S. PATENT DOCUMENTS

| 8,415,771 | B1 * | 4/2013 | Golda ..................... H01L 24/75 257/621 |
| 9,136,161 | B2 | 9/2015 | Bibl et al. |
| 9,484,237 | B2 | 11/2016 | Bibl et al. |
| 9,969,078 | B2 | 5/2018 | Chen et al. |
| 2014/0355168 | A1 | 12/2014 | Bibl et al. |
| 2015/0340262 | A1 | 11/2015 | Bibl et al. |
| 2017/0036342 | A1 * | 2/2017 | Chen ....................... H01L 24/75 |
| 2017/0278733 | A1 | 9/2017 | Chang et al. |

FOREIGN PATENT DOCUMENTS

| CN | 1405843 | 3/2003 | |
| CN | 105263854 | 1/2016 | |
| CN | 106058001 A | * 10/2016 | ......... H01L 21/6833 |
| CN | 106395736 | 2/2017 | |
| TW | M443933 | 12/2012 | |

* cited by examiner

*Primary Examiner* — Peter Dungba Vo
*Assistant Examiner* — Azm A Parvez
(74) *Attorney, Agent, or Firm* — JCIPRNET

(57) ABSTRACT

A micro pick-up array used to pick up a micro device is provided. The micro pick-up array includes a substrate, a pick-up structure, and a soft polymer layer. The pick-up structure is located on the substrate. The pick-up structure includes a cured photo sensitive material. The soft polymer layer covers the pick-up structure. A manufacturing method of a micro pick-up array is also provided.

12 Claims, 10 Drawing Sheets

MICRO PICK UP ARRAY AND MANUFACTURING METHOD THEREOF

CROSS-REFERENCE TO RELATED APPLICATION

This application claims the priority benefit of Taiwan application serial no. 106135572, filed on Oct. 18, 2017. The entirety of the above-mentioned patent application is hereby incorporated by reference herein and made a part of this specification.

BACKGROUND OF THE DISCLOSURE

1. Field of the Disclosure

The disclosure relates to a micro pick-up array. Also, the disclosure relates to a micro pick-up array including a pick-up structure and a manufacturing method thereof.

2. Description of Related Art

Currently, after performing a singulation process to form a plurality of dies on a wafer, a micro pick-up array is used most of the time to pick up the separated dies and to transfer the dies to places to be located. With technology advances, more and more dense dies can be fabricated on the same area of a wafer, such that, the pick-up array is required to have enhanced precision so as to be precisely aligned with the dies.

Generally, the polymer material is poured into a mold, and after the polymer material is cured, a micro pick-up array can be manufactured. Nevertheless, in the micro pick-up array manufactured through the foregoing method, deformation (shape changing) occurs easily during demolding as affected by stress. The precision of the micro pick-up array is thus reduced, and as a position deviation quantity reaches approximately $1/100$, each of the devices to be picked up can not be precisely aligned with. In addition, a polymer material layer with a considerably thick thickness is required by the micro pick-up array manufactured through such method, a long period of time for curing is thereby needed. Therefore, a method is needed urgently to solve the foregoing problem.

SUMMARY OF THE DISCLOSURE

The disclosure provides a micro pick-up array having a pick-up structure capable of enhancing an alignment precision of picking up devices by the micro pick-up array.

A micro pick-up array of an embodiment of the disclosure is used to pick up a micro device. The micro pick-up array includes a substrate, a pick-up structure, and a soft polymer layer. The pick-up structure is located on the substrate. The pick-up structure is composed of a photo sensitive material. The soft polymer layer covers the pick-up structure.

The disclosure further provides a manufacturing method of a micro pick-up array. A substrate is provided. A pick-up structure is formed on the substrate. The pick-up structure includes a photo sensitive material. A soft polymer layer is formed on the pick-up structure.

To sum up, the micro pick-up array has the pick-up structure. The pick-up structure is formed through a photo-lithography process; hence, the pick-up structure is less likely to be deformed during the manufacturing process. An alignment precision of picking up the device by the micro pick-up array is thereby enhanced. In addition, the pick-up structure may be made to be considerably small in size and thus the thickness of the soft polymer layer can be thinner. In this way, not only relatively more sophisticated micro devices can be picked up, considerable time for curing can also be saved.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

The terms used herein such as "about", "approximate", or "substantial" include a related value and an average within an acceptable deviation range of specific values determined by those with ordinary skills in the art with consideration of discussed measurement and a specific number of errors related to the measurement (i.e. a limitation of a measurement system). For example, the term "about" represents to be within one or a plurality of standard deviations of the related value, or within ±30%, ±20%, ±10%, ±5%. Moreover, a relatively acceptable range of deviation or standard deviation may be chosen for the term "about," "approximately" or "substantially" as used herein based on optical properties, etching properties or other properties, instead of applying one standard deviation across all the properties.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 1:
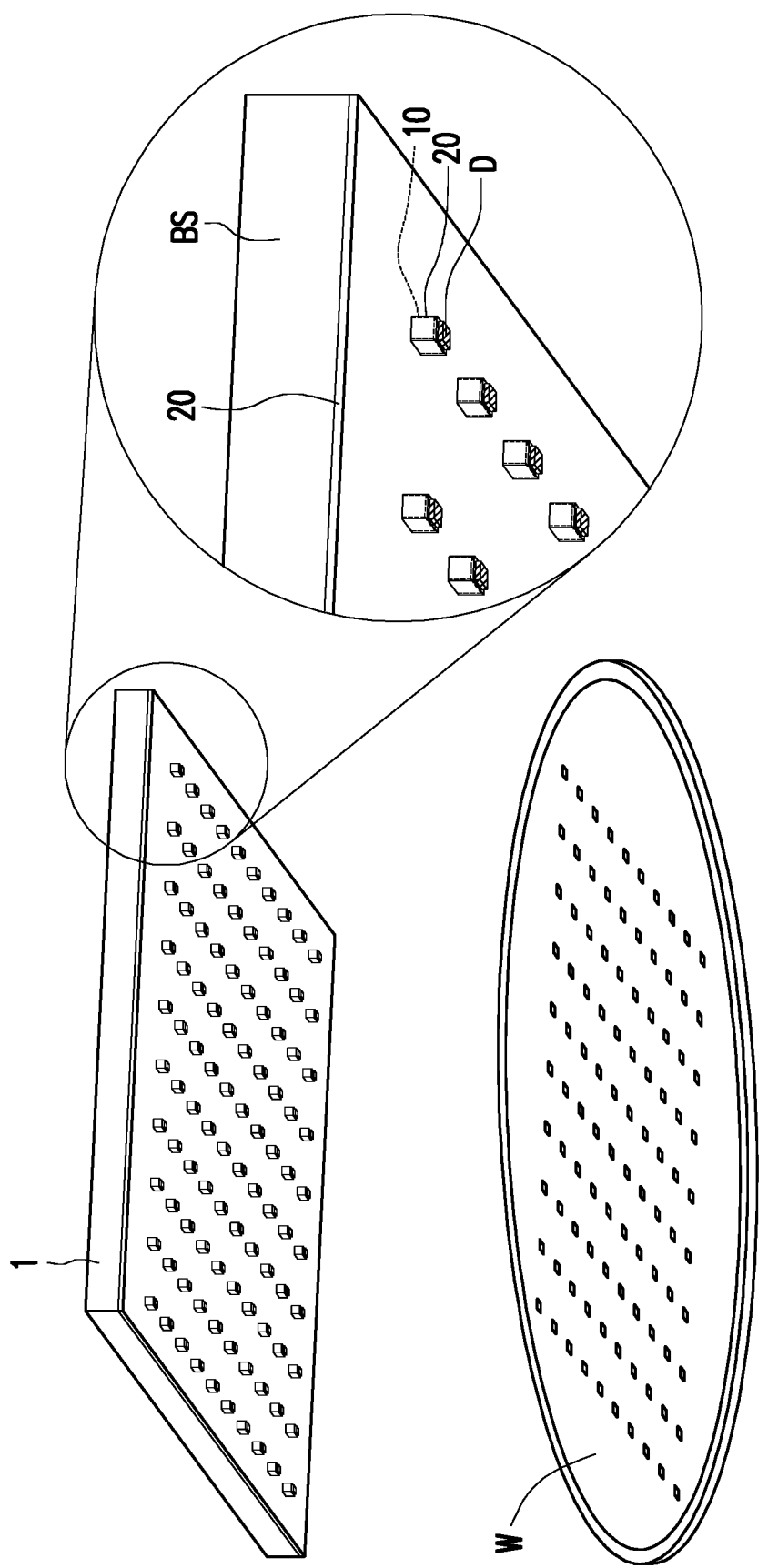
FIG. 1 is a schematic diagram of a micro pick-up array according to an embodiment of the disclosure.

FIG. 1 is a schematic diagram of a micro pick-up array according to an embodiment of the disclosure.

A micro pick-up array 1 includes a substrate BS, a pick-up structure 10, and a soft polymer layer 20. The pick-up structure 10 is located on the substrate BS. The pick-up structure 10 includes a cured photo sensitive material. In an embodiment, the cured photo sensitive material can be a transparent material. The soft polymer layer 20 covers the pick-up structure 10. In an embodiment, the micro pick-up array 1 is used to pick up a micro device D (e.g., a micro die) on a wafer W, which should however not be construed as limitations to the disclosure. In other embodiments, the micro pick-up array 1 may also be used to pick up other micro devices, such as a micro light-emitting device, a micro transistor, a micro control circuit, or other suitable micro devices. Herein, a micro size is less than about 100 μm, and preferably less than about 60 μm.

In an embodiment, when the micro pick-up array 1 presses on the micro device D, the soft polymer layer 20 on a surface of the micro pick-up array 1 is recessed inwardly, such that the van der Waals force of a certain degree is generated between the soft polymer layer 20 and the micro device D. In an embodiment, when a moving speed of the micro pick-up array 1 is controlled, it can be selected to pick up the micro device D or to place the micro device D. In an embodiment, different levels of conformal-contact are formed according to different micro pick-up speeds, and thus whether to pick up or put down the micro device D is controlled.

FIG. 2A to FIG. 2F are schematic diagrams of a manufacturing method of a micro pick-up array according to an embodiment of the disclosure. It should be noted that the reference numerals and a part of the contents in the embodiment of FIG. 1 are also used to describe the embodiments of FIG. 2A to FIG. 2F, in which the same reference numerals are used to represent identical or similar elements, and thus descriptions of the same technical contents are omitted. Please refer to the descriptions of the previous embodiment for the omitted contents, which will not be repeated hereinafter.

Figure 2A:
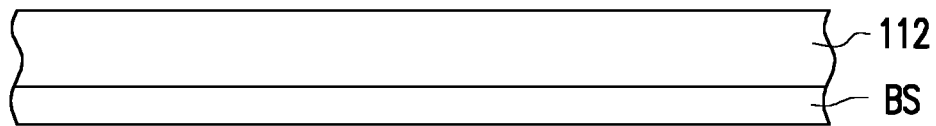
FIG. 2A to FIG. 2F are schematic diagrams of a manufacturing method of a micro pick-up array according to an embodiment of the disclosure.

With reference to FIG. 2A, the substrate BS is provided. A material of the substrate BS may include glass, quartz, organic polymer, or other suitable materials. A photo sensitive material 112 is formed on the substrate BS, and a method of forming the photo sensitive material 112 includes, for example, a spin coating process. In this embodiment, the photo sensitive material 112 may include a negative photoresist, for example, a negative photoresist resin, a solvent, and other substances, for example, at least one of a pigment, a photo initiator, a monomer, and an additive. In other embodiments, the photo sensitive material 112 may also include a positive photoresist, for example, a positive photoresist resin, a solvent, and other substances, for example, at least one of a pigment, a photo initiator, a monomer and an additive. In an embodiment, a soft baking process is performed after coating the photo sensitive material 112, so as to remove a redundant solvent in the photo sensitive material 112. In this way, uniformity and adhesion of the photo sensitive material 112 on the substrate BS can be improved.

Figure 2B:
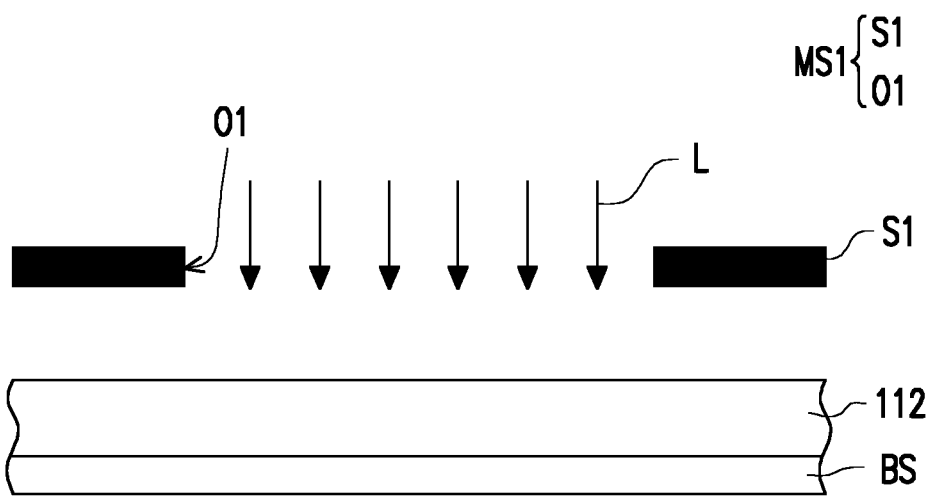

With reference to FIG. 2B next, a photo mask MS1 is provided onto the photo sensitive material 112, and the photo mask MS1 includes a mask S1 and an opening O1. A light L (e.g., an ultraviolet light) penetrates through the opening O1 of the photo mask MS1 and irradiates onto the photo sensitive material 112. After the photo sensitive material 112 is irradiated by the light L, a post exposure baking process is performed to increase physical differences between an exposed portion of the photo sensitive material 112 (such as some portion of the photo sensitive material 112 exposed by the opening O1) and an unexposed portion of the photo sensitive material 112 (such as some portion of the photo sensitive material 112 overlapped by the mask S1), thereby increasing a yield rate of a subsequent developing process.

Figure 2C:
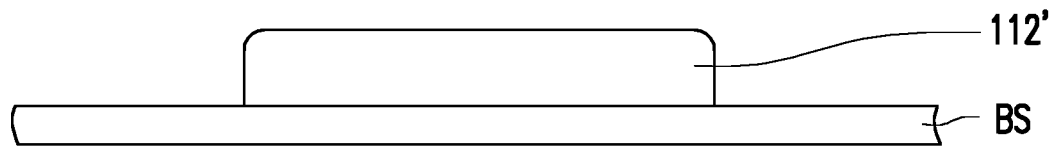

Reference to FIG. 2C, the developing process is performed. The photo sensitive material 112 made of a negative photoresist is taken as an example in this embodiment. A portion of the photosensitive material 112 that is irradiated with the light L causes a cross-linking reaction, and the portion of the photo sensitive material 112 becomes a photo sensitive material 112' with a greater degree of cross-linking. After the developing process is performed, the photo sensitive material 112' with a greater degree of cross-linking is remained, and a portion of the photo sensitive material 112 with a lower degree of cross-linking is washed away. In other embodiments, if the photo sensitive material 112 is a positive photoresist, a cracking reaction is generated at a portion of the photo sensitive material 112 being irradiated by the light L, and the portion of the photo sensitive material 112 becomes a photo sensitive material 112 with a lower degree of cross-linking. After the developing process is performed, the photo sensitive material 112' not irradiated by the light L (e.g., the photo sensitive material with a greater degree of cross-linking) is remained, and the portion of the photo sensitive material 112 irradiated by the light L (e.g., the portion of the photo sensitive material 112 with a lower degree of cross-linking) is washed away.

In an embodiment, after the developing process is performed, a hard baking process is further performed to the photo sensitive material 112', so as to enhance a degree of hardness of the cured photo sensitive material 112'.

Figure 2D:
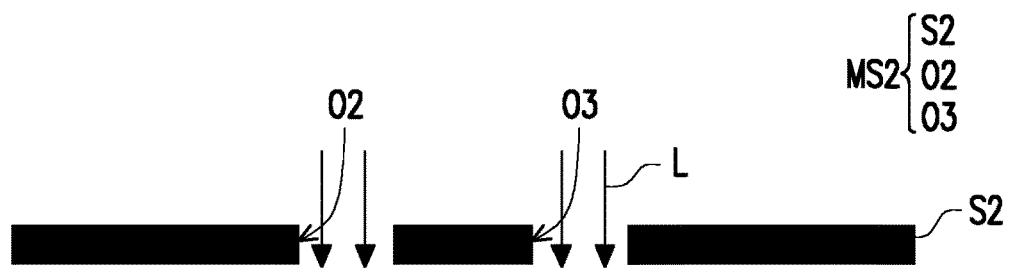

Reference to FIG. 2D, another layer of a photo sensitive material 114 is formed on the photo sensitive material 112' and the substrate BS. The photo sensitive material 114 is, for example, similar to the photo sensitive material 112. The soft baking process is also performed after coating the photo sensitive material 114 in an embodiment.

Next, a photo mask MS2 is provided onto the photo sensitive material 114, and the photo mask MS2 includes a mask S2, an opening O2, and an opening O3. The light L (e.g., the ultraviolet light) penetrates through the opening O2 and the opening O3 of the photo mask MS2 and irradiates onto the photo sensitive material 114. In an embodiment, after the light L irradiates the photo sensitive material 114, the post exposure baking process is performed to increase the physical differences between an exposed portion of the photo sensitive material 114 (such as some portion of the photo sensitive material 114 exposed by the opening O2 and the opening O3) and an unexposed portion of the photo sensitive material 114 (such as some portion of the photo sensitive material 114 overlapped by the mask S2), thereby increasing the yield rate of the subsequent developing process.

Figure 2E:
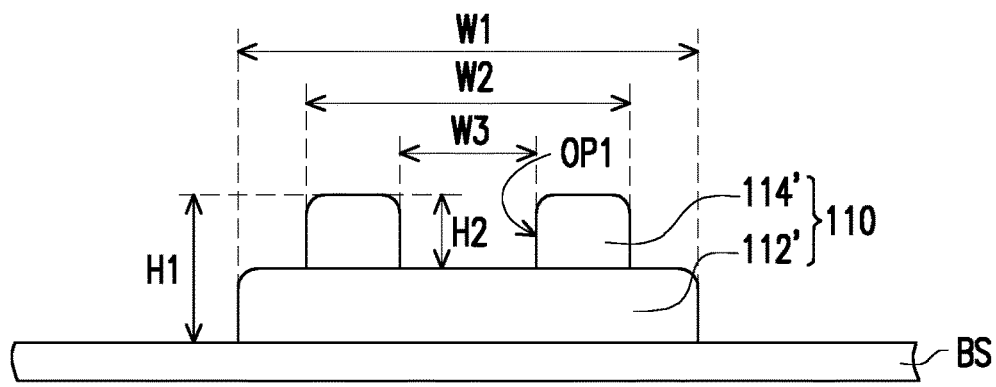

Reference to FIG. 2E, the developing process is performed. The photo sensitive material 114 made of the negative photoresist is taken as an example in this embodiment. A portion of the photosensitive material 114 that is irradiated with the light L causes a cross-linking reaction, and the portion of the photo sensitive material 114 becomes a photo sensitive material 114' with a greater degree of cross-linking. After the developing process is performed, the photo sensitive material 114' with a greater degree of cross-linking is remained, and the photo sensitive material 114 with a lower degree of cross-linking is washed away. In other embodiments, if the photo sensitive material 114 is a positive photoresist, a portion of the photo sensitive material 114 irradiated by the light L causes a decomposition reaction, and the portion of the photo sensitive material 114 becomes a photo sensitive material 114 with a lower degree of cross-linking. After the developing process is performed, the photo sensitive material 114' not irradiated by the light L (e.g., the photo sensitive material with a greater degree of cross-linking) is remained, and the portion of the photo sensitive material 114 irradiated by the light L (e.g., the portion of the photo sensitive material 114 with a lower degree of cross-linking) is washed away. In this embodiment, the photo sensitive material 112' and the photo sensitive material 114' may be formed in a same photolithography process by using a half-tone mask. Herein, FIG. 3A may be referred to for the half-tone mask.

In an embodiment, after the developing process is performed, the hard baking process is further performed to the photo sensitive material 114', so as to enhance a degree of hardness of the cured photo sensitive material 114'.

A pick-up structure 110 includes the photo sensitive material 112' and the photo sensitive material 114' in this embodiment. In an embodiment, a width W2 of the photo sensitive material 114' is less than a width W1 of the photo sensitive material 112'. Moreover, an outer side surface of the pick-up structure 110 is stair-shaped (or namely step-shaped), which should however not be construed as limitations to the disclosure. In other embodiments, the width of the photo sensitive material 114' is approximately equal to the width of the photo sensitive material 112', and a side surface of the photo sensitive material 114' is aligned with or substantially aligned with a side surface of the photo sensitive material 112'. In an embodiment, the width W1 of the photo sensitive material 112' and the width W2 of the photo sensitive material 114' are approximately between 10 μm and 1000 μm.

The pick-up structure 110 has a recess OP1 in an embodiment. A width W3 of the recess OP1 is approximately between 5 μm and 100 μm but may be adjusted according to an actual size of a pick-up device D. When the pick-up device D is picked up by the pick-up structure 110, the pick-up device D is covered by the recess OP1 to be retrieved, preferably. In an embodiment, a thickness H1 of the pick-up structure 110 and a depth H2 of the recess OP1 are approximately between 5 μm and 20 μm but may be adjusted according to the actual size of the pick-up device D. The depth H2 of the recess OP1 is approximately equal to a thickness of the photo sensitive material 114' in this embodiment. The depth H2 of the recess OP1 may be greater than or less than the thickness of the photo sensitive material 114' in other embodiments.

A micro pick-up array 100 is formed by a plurality of the pick-up structures 110 arranged in an array in this embodiment. Since the pick-up structure 110 is manufactured by the photolithography process, the pick-up structure 110 can have a favorable alignment precision, for example, a position deviation quantity of approximately 1/1000000. Therefore, when an area of the micro pick-up array 100 is enlarged, the alignment precision is not lowered considerably, meanwhile a number of the micro device D transposed and picked up by the micro pick-up array 100 increased. A product yield rate and a transposition speed of picking up the micro device D can thus be considerably increased.

Figure 2F:
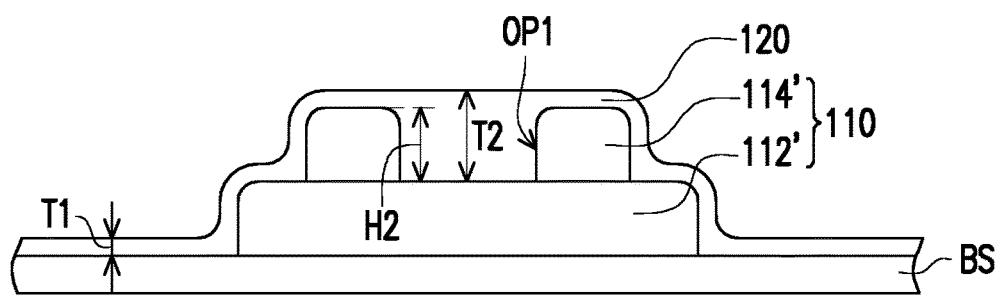

With reference to FIG. 2F, a soft polymer layer 120 is formed on the pick-up structure 110. In this embodiment, the soft polymer layer 120 is conformal to the pick-up structure 110, and the soft polymer layer 120 fills into the recess OP1 of the pick-up structure 110. The soft polymer layer 120 can fill up the entire recess OP1 in an embodiment.

In an embodiment, a method of forming the soft polymer layer 120 includes forming a soft polymer material first on the pick-up structure 110 by means of coating (e.g., spin coating) or printing, for example. The soft polymer material is then heated, such that the soft polymer material is cured into the soft polymer layer. In some embodiments, a material of the soft polymer layer 120 includes, for example, polydimethylsiloxane, rubber, or other suitable materials.

In an embodiment, a thickness T1 of a portion of the soft polymer layer 120 outside the recess OP1 may be approximately between 5 μm to 50 μm. In an embodiment, a thickness T2 of a portion of the soft polymer layer 120 aligned with the recess OP1 may be approximately between 10 μm to 50 μm. In an embodiment, the recess OP1 is used to be aligned with a position of a device (e.g., the micro device D in FIG. 1) to be picked up. The soft polymer layer 120 filling into the recess OP1 has the thicker thickness T2; hence, a process tolerance is increased when the micro pick-up array 100 pressing down to retrieve the micro device D. Therefore, the micro pick-up array 100 is less likely to damage the picked-up micro device D owing to over-pressing.

Based on the above, the micro pick-up array 100 of this embodiment has the pick-up structure 110. Since the pick-up structure 110 is formed through the photolithography process, a deformation of the pick-up structure 110 is not easy to be generated during the manufacturing process. An alignment precision of picking up the micro device by the micro pick-up array is thereby enhanced. In addition, the pick-up structure 110 may be made to be considerably small in size and thus the thickness of the soft polymer layer can be thinner. In this way, not only relatively more sophisticated devices can be picked up, considerable time for curing can also be saved.

Figure 3A:
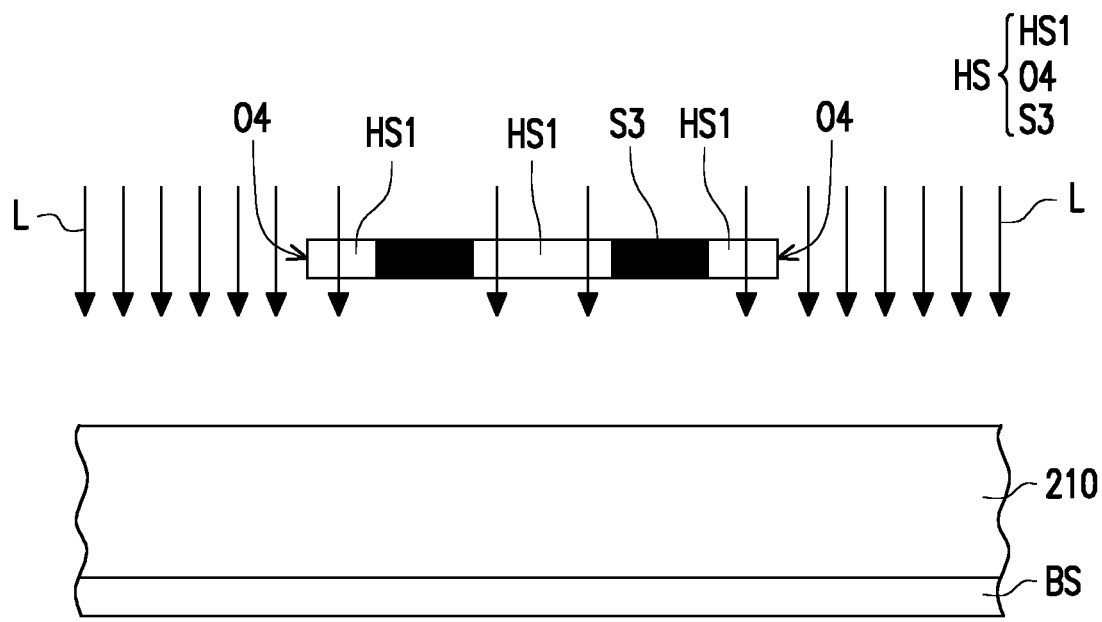
FIG. 3A to FIG. 3C are schematic diagrams of a manufacturing method of a micro pick-up array according to an embodiment of the disclosure.
Figure 3B:
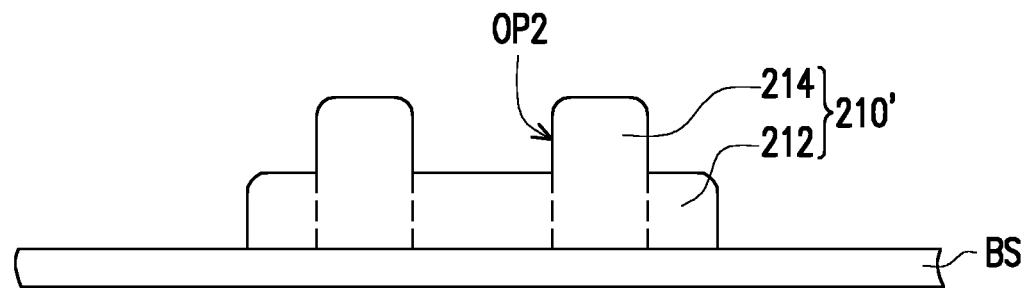
Figure 3C:
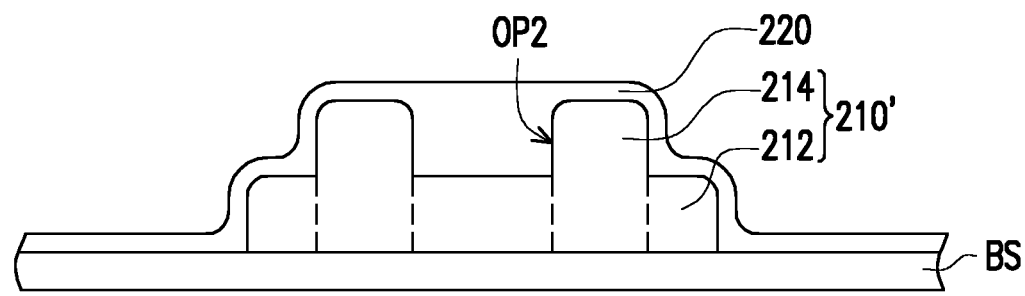

FIG. 3A to FIG. 3C are schematic diagrams of a manufacturing method of a micro pick-up array according to an embodiment of the disclosure. It should be noted that the reference numerals and a part of the contents in the embodiment of FIG. 2A to FIG. 2F are also used to describe the embodiments of FIG. 3A to FIG. 3C, in which the same reference numerals are used to represent identical or similar elements, and thus descriptions of the same technical contents are omitted. Please refer to the descriptions of the previous embodiment for the omitted contents, which will not be repeated hereinafter.

A difference between the embodiment of FIG. 3A to FIG. 3C and the embodiment of FIG. 2A to FIG. 2F is that a photo sensitive material 210 includes the positive photoresist in the embodiment of FIG. 3A to FIG. 3C.

With reference to FIG. 3A first, the photo sensitive material 210 is formed on the substrate BS, and the method of forming the photo sensitive material 210 includes, for example, the spin coating process. In this embodiment, the photo sensitive material 210 may include the positive photoresist, for example, the positive photoresist resin, the solvent, and other substances, for example, at least one of the pigment, the photo initiator, the monomer and the additive. In an embodiment, the soft baking process is further performed after coating the photo sensitive material 210, so as to remove a redundant solvent in the photo sensitive material 210. In this way, uniformity and adhesion of the photo sensitive material 210 on the substrate BS can be improved.

A half-tone mask HS is provided onto the photo sensitive material 210, and the half-tone mask HS may include a mask S3, an opening O4, and an area with at least one type of transmittance, for example, a half-tone area HS1, located between the mask S3 and the opening O4. The light L is shielded by the mask S3. The opening O4 does not shield the light L, and the half-tone area HS1 does not completely shield the light L. Hence, part of the light L can irradiate onto the photo sensitive material 210 respectively through the opening O4 and the half-tone area HS1. In an embodiment, after the light L irradiates the photo sensitive material 210, the post exposure baking process is performed, so as to increase the physical differences between a portion of the photo sensitive material 210 being exposed and a portion of the photo sensitive material 210 not being exposed and to increase the yield rate of the subsequent developing process.

With reference to FIG. 3B, in this embodiment, since the photo sensitive material 210 includes the positive photoresist, the light L irradiates a portion of the photo sensitive material 210, and break molecule bonds of the portion of the photo sensitive material 210 into a lower degree cross-linking. The portion of the photo sensitive material 210 with a lower degree of cross-linking is removed in the developing process, and a portion of the photo sensitive material 210 with a relatively higher degree of cross-linking is remained. The portion of the photo sensitive material 210 remained is a pick-up structure 210' in this embodiment. In some embodiments, the photo sensitive material 210 may also include the negative photoresist, and the foregoing embodiments can be referred to for related descriptions and principles thereof.

In an embodiment, after the development process, the pick-up structure 210' is performed to a hard baking process to increase a hardness of the cured pick-up structure 210'.

In this embodiment, the pick-up structure 210' includes a first block 212 defined through the half-tone area HS1 and a second block 214 defined through the mask S3. A height of the second block 214 is greater than a height of the first block 212 in this embodiment. The second block 214 can surround a portion of the first block 212 and define a recess OP2.

With reference to FIG. 3C, a soft polymer layer 220 is formed on the pick-up structure 210'. In this embodiment, the soft polymer layer 220 covers the pick-up structure 210' and fills into the recess OP2 of the photo sensitive material 210'. Since an outer side of the pick-up structure 210' is stair-shaped (or namely step-shaped), poor coverage of the photo sensitive material 210' on the soft polymer layer 220 owing to climbing is lessened.

Based on the above, the micro pick-up array 200 of this embodiment has the pick-up structure 210'. The pick-up structure 210' is formed through the photolithography process; hence, the pick-up structure 210' is less likely to be deformed during the manufacturing process. The alignment precision of picking up the micro device by the micro pick-up array 200 is thereby enhanced. In addition, the pick-up structure 210' may be made to be considerably small in size and thus the thickness of the soft polymer layer can be thinner. In this way, not only relatively more sophisticated micro devices can be picked up, considerable time for curing can also be saved.

Figure 4:
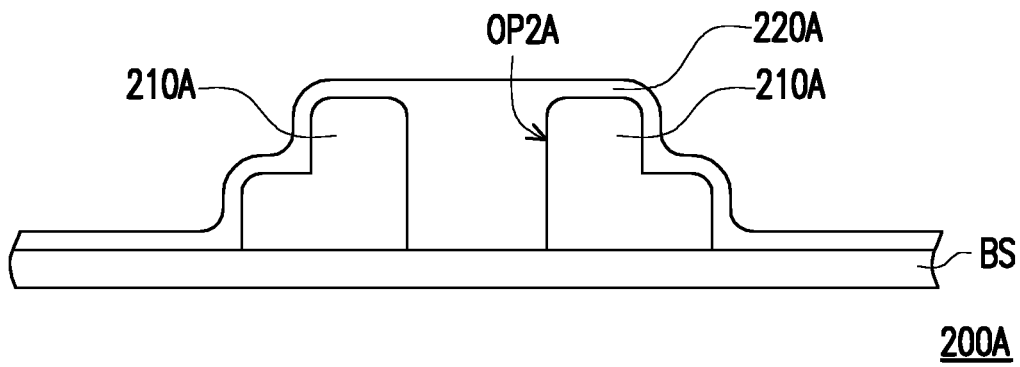
FIG. 4 is a schematic diagram of a micro pick-up array according to an embodiment of the disclosure.

FIG. 4 is a schematic diagram of a micro pick-up array according to an embodiment of the disclosure. It should be noted that the reference numerals and a part of the contents in the embodiment of FIG. 3A to FIG. 3C are also used to describe the embodiment of FIG. 4, in which the same reference numerals are used to represent identical or similar elements, and thus descriptions of the same technical contents are omitted. Please refer to the descriptions of the previous embodiment for the omitted contents, which will not be repeated hereinafter.

A difference between the embodiment of FIG. 4 and the embodiment of FIG. 3A to FIG. 3C includes that a depth of a recess OP2A of a pick-up structure 210A of FIG. 4 is different from a depth of the recess OP2 of the pick-up structure 210' of FIG. 3C.

In this embodiment, the recess OP2A of the pick-up structure 210A penetrates through the pick-up structure 210A and exposes a portion of an upper surface of the substrate BS. A soft polymer layer 220A fills into the recess OP2A and is in contact with the substrate BS directly. In an embodiment, a material of the pick-up structure 210A includes, for example, the positive photoresist or the negative photoresist.

Based on the above, a micro pick-up array 200A of this embodiment has the pick-up structure 210A. The pick-up structure 210A is formed through the photolithography process; hence, the pick-up structure 210A is less likely to be deformed during the manufacturing process. The alignment precision of picking up the micro device by the micro pick-up array 200A is thereby enhanced. In addition, the micro pick-up array 200A may be made to be considerably small in size and thus the thickness of the soft polymer layer can be thinner. In this way, not only relatively more sophisticated micro devices can be picked up, considerable time for curing can also be saved.

Figure 5:
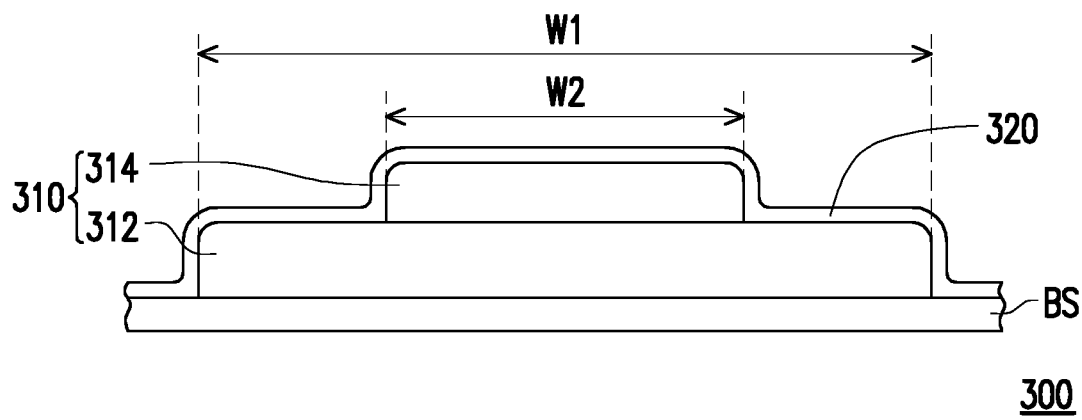
FIG. 5 is a schematic diagram of a micro pick-up array according to an embodiment of the disclosure.

FIG. 5 is a schematic diagram of a micro pick-up array according to an embodiment of the disclosure. It should be noted that the reference numerals and a part of the contents in the embodiment of FIG. 2A to FIG. 2F are also used to describe the embodiment of FIG. 5, in which the same reference numerals are used to represent identical or similar elements, and thus descriptions of the same technical contents are omitted. Please refer to the descriptions of the previous embodiment for the omitted contents, which will not be repeated hereinafter.

A difference between the embodiment of FIG. 5 and the embodiment of FIG. 2F includes that a shape of a pick-up structure 310 of FIG. 5 is different from a shape of the pick-up structure 110 of FIG. 2F.

In this embodiment, the pick-up structure 310 includes a photo sensitive material 312 and a photo sensitive material 314 located on the photo sensitive material 312. The photo sensitive material 312 is sandwiched between the photo sensitive material 314 and the substrate BS. In this embodiment, a width W2 of the photo sensitive material 314 is less than a width W1 of the photo sensitive material 312. In other embodiments, the width of the photo sensitive material 314 is approximately equal to the width of the photo sensitive material 312. In an embodiment, a material of the pick-up structure 310 includes, for example, the positive photoresist or the negative photoresist. The photo sensitive material 312 and the photo sensitive material 314 may be formed in the same photolithography process or in different photolithography processes.

In this embodiment, the pick-up structure 310 does not have a recess, and a soft polymer layer 320 is conformal to the pick-up structure 310.

Based on the above, a micro pick-up array 300 of this embodiment has the pick-up structure 310. The pick-up structure 310 is formed through the photolithography process; hence, the pick-up structure 310 is less likely to be deformed during the manufacturing process. The alignment precision of picking up the micro device by the micro pick-up array 300 is thereby enhanced. In addition, the micro pick-up array 300 may be made to be considerably small in size and thus the thickness of the soft polymer layer can be thinner. In this way, not only relatively more sophisticated micro devices can be picked up, considerable time for curing can also be saved.

Figure 6:
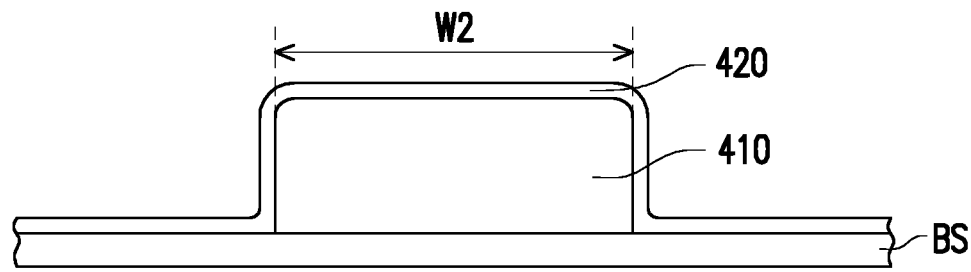
FIG. 6 is a schematic diagram of a micro pick-up array according to an embodiment of the disclosure.

FIG. 6 is a schematic diagram of a micro pick-up array according to an embodiment of the disclosure. It should be noted that the reference numerals and a part of the contents in the embodiment of FIG. 3A to FIG. 3C are also used to describe the embodiment of FIG. 6, in which the same reference numerals are used to represent identical or similar elements, and thus descriptions of the same technical contents are omitted. Please refer to the descriptions of the previous embodiment for the omitted contents, which will not be repeated hereinafter.

A difference between the embodiment of FIG. 6 and the embodiment of FIG. 3C includes that a surface of an outer side of a pick-up structure 410 of FIG. 6 is a continuous surface rather than a stair-shaped surface.

In an embodiment, a material of the pick-up structure 410 includes, for example, the positive photoresist or the negative photoresist. In an embodiment, the material of the pick-up structure 410 is the negative photoresist, and the pick-up structure 410 can be completed through one photolithography process, such that a time for manufacturing the pick-up structure 410 can be reduced. The surface of the outer side of the pick-up structure 410 is a continuous surface in this embodiment. Widths W2 of the pick-up structure 410 are substantially uniform in an embodiment. A soft polymer layer 420 is conformal to the pick-up structure 410.

Based on the above, a micro pick-up array 400 of this embodiment has the pick-up structure 410. The pick-up structure 410 is formed through the photolithography process; hence, the pick-up structure 410 is less likely to be deformed during the manufacturing process. A precision of picking up the micro device by the micro pick-up array is thereby enhanced. In addition, the micro pick-up array 400 may be made to be considerably small in size and thus the thickness of the soft polymer layer can be thinner. In this way, not only relatively more sophisticated micro devices can be picked up, considerable time for curing can also be saved.

FIG. 7A to FIG. 7D are schematic diagrams of a manufacturing method of a micro pick-up array according to an embodiment of the disclosure. It should be noted that the reference numerals and a part of the contents in the embodiment of FIG. 6 are also used to describe the embodiments of FIG. 7A to FIG. 7D, in which the same reference numerals are used to represent identical or similar elements, and thus descriptions of the same technical contents are omitted. Please refer to the descriptions of the previous embodiment for the omitted contents, which will not be repeated hereinafter.

Figure 7A:
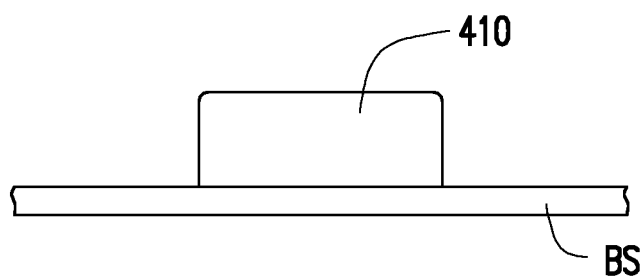
FIG. 7A to FIG. 7D are schematic diagrams of a manufacturing method of a micro pick-up array according to an embodiment of the disclosure.

With reference to FIG. 7A, the pick-up structure 410 is formed on the substrate BS, and a method of forming the pick-up structure 410 includes, for example, the photolithography process.

Figure 7B:
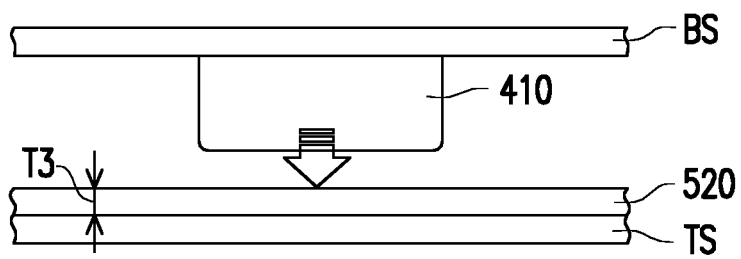
Figure 7C:
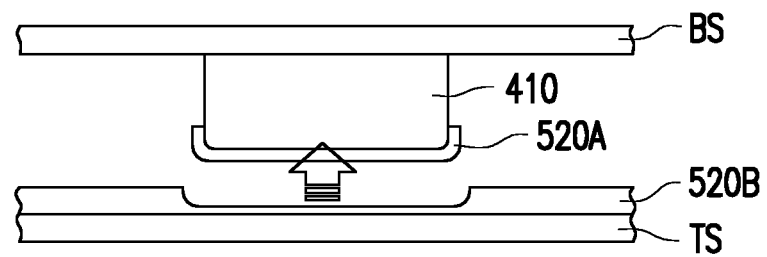

With reference to FIG. 7B and FIG. 7C, a soft polymer material 520 is coated onto a transfer substrate TS, and a method of coating the soft polymer material 520 includes, for example, the spin coating process. In an embodiment, a thickness T3 of the soft polymer material 520 on the transfer substrate TS is for example approximately between 10 μm and 300 μm.

The soft polymer material 520 on the transfer substrate TS is dipped by the pick-up structure 410. A portion of a soft polymer material 520A is attached onto the pick-up structure 410, and another portion of a soft polymer material 520B is remained on the transfer substrate TS.

In this embodiment, the pick-up structure 410 faces the transfer substrate TS with an upper surface thereof so as to be in contact with the soft polymer material 520, as such, only the upper surface and a portion of a side surface of the pick-up structure 410 are dipped with the soft polymer material 520. Therefore, a portion of the soft polymer material 520A does not completely cover the side surface of the pick-up structure 410.

Figure 7D:
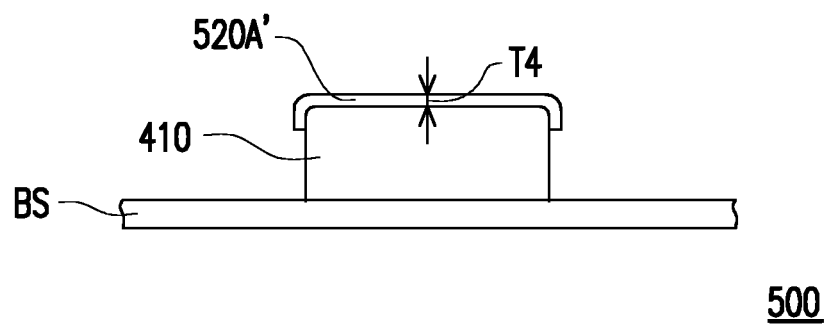

With reference to FIG. 7D, the baking process is performed. In some embodiments, the baking process is performed at a temperature of 60 degrees to 180 degrees, for example. In some embodiments, the baking process is performed for 10 minutes to 24 hours, for example. After the baking process is performed, the soft polymer material 520A on the pick-up structure 410 is cured into a soft polymer layer 520A'. In some embodiments, a thickness T4 of the soft polymer layer 520A' is for example approximately between 10 μm and 50 μm.

Based on the above, a micro pick-up array 500 of this embodiment has the pick-up structure 410. The pick-up structure 410 is formed through the photolithography process; hence, the pick-up structure 410 is less likely to be deformed during the manufacturing process. The alignment precision of picking up the micro devices by the micro pick-up array 200 is thereby enhanced. In addition, the micro pick-up array 500 may be made to be considerably small in size and thus the thickness of the soft polymer layer can be thinner. In this way, not only relatively more sophisticated micro devices can be picked up, considerable time for curing can also be saved.

FIG. 8A to FIG. 8D are schematic diagrams of a manufacturing method of a micro pick-up array according to an embodiment of the disclosure. It should be noted that the reference numerals and a part of the contents in the embodiment of FIG. 2A to FIG. 2F are also used to describe the embodiments of FIG. 8A to FIG. 8D, in which the same reference numerals are used to represent identical or similar elements, and thus descriptions of the same technical contents are omitted. Please refer to the descriptions of the previous embodiment for the omitted contents, which will not be repeated hereinafter.

Figure 8A:
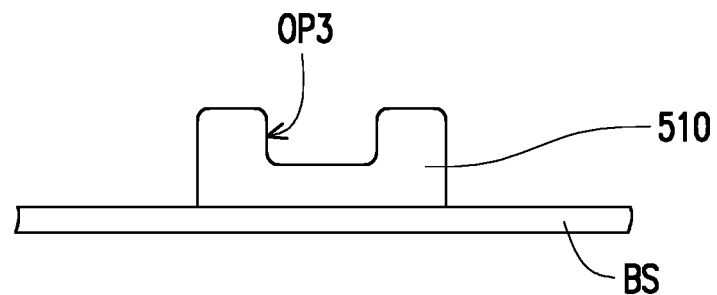
FIG. 8A to FIG. 8D are schematic diagrams of a manufacturing method of a micro pick-up array according to an embodiment of the disclosure.

With reference to FIG. 8A, a pick-up structure 510 is formed on the substrate BS, and a method of forming the pick-up structure 510 includes, for example, the photolithography process. The pick-up structure 510 has a recess OP3 in this embodiment.

Figure 8B:
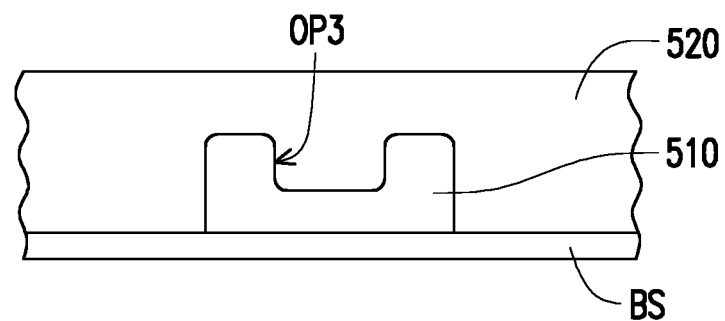

With reference to FIG. 8B, the soft polymer material 520 is formed on the pick-up structure 510 through coating, and the soft polymer material 520 fills into the recess OP3 of the pick-up structure 510. The soft polymer material 520 is also formed on the substrate BS in an embodiment.

Figure 8C:
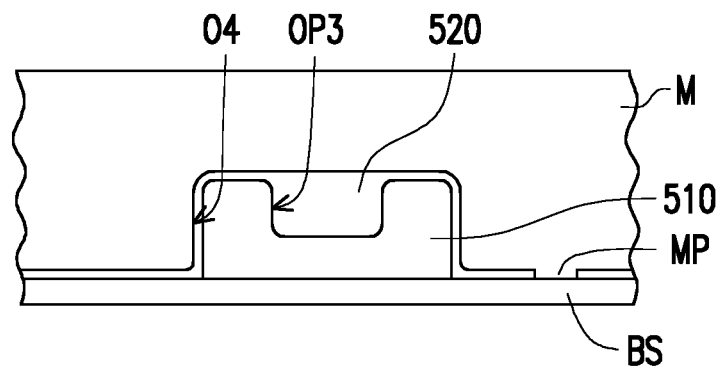
Figure 8D:
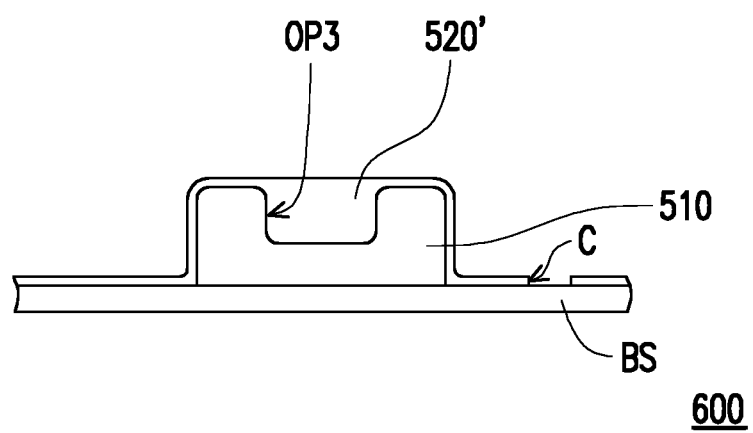

With reference to FIG. 8C and FIG. 8D, a mold M is pressed onto the substrate BS. The mold M includes an opening O4 aligned with the pick-up structure 510. In an embodiment, the mold M is in contact with the substrate BS; nevertheless, the mold M is not in contact with the pick-up structure 510. In an embodiment, a portion of the mold M in contact with the substrate BS is a protruding portion MP, and most of a surface of the substrate BS is not in contact with the mold M. Therefore, a portion of the soft polymer material 520 extends along the surface of the substrate BS.

The baking process is performed to heat the soft polymer material 520, such that the soft polymer material 520 is cured into a soft polymer layer 520'. The soft polymer material 520 is heated in the mold M in an embodiment. A portion of the soft polymer layer 520' aligned with the protruding portion MP of the mold M has an opening C in an embodiment.

Based on the above, a micro pick-up array 600 of this embodiment has the pick-up structure 510. The pick-up structure 510 is formed through the photolithography process; hence, the pick-up structure 510 is less likely to be deformed during the manufacturing process. The alignment precision of picking up the devices by the micro pick-up array 600 is thereby enhanced. In addition, the micro pick-up array 600 may be made to be considerably small in size and thus the thickness of the soft polymer layer can be thinner. In this way, not only relatively more sophisticated devices can be picked up, considerable time for curing can also be saved.

Figure 9A:
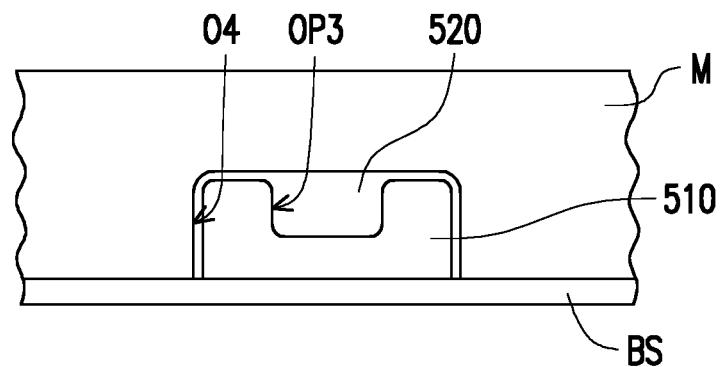
FIG. 9A and FIG. 9B are schematic diagrams of a manufacturing method of a micro pick-up array according to an embodiment of the disclosure.
Figure 9B:
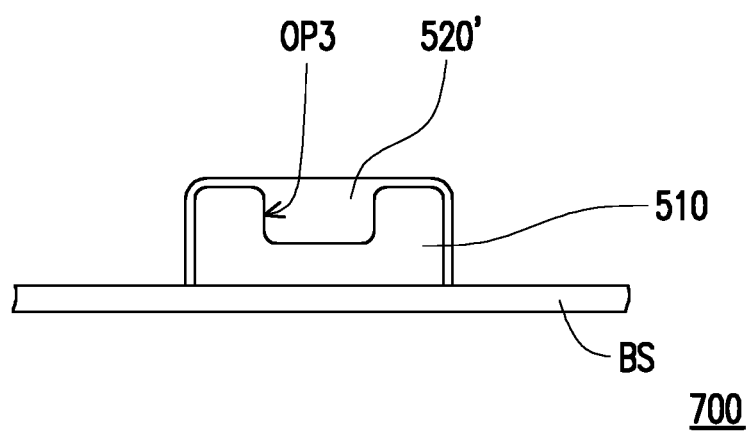

FIG. 9A and FIG. 9B are schematic diagrams of a manufacturing method of a micro pick-up array according to an embodiment of the disclosure. It should be noted that the reference numerals and a part of the contents in the embodiments of FIG. 8A to FIG. 8D are also used to describe the embodiments of FIG. 9A and FIG. 9B, in which the same reference numerals are used to represent identical or similar elements, and thus descriptions of the same technical contents are omitted. Please refer to the descriptions of the previous embodiment for the omitted contents, which will not be repeated hereinafter.

A difference between the embodiment of FIG. 9A and FIG. 9B and the embodiment of FIG. 8A to FIG. 8D includes that the mold M does not have the protruding portion MP in the embodiment of FIG. 9A and FIG. 9B.

With reference to FIG. 9A and FIG. 9B, in this embodiment, the mold M is not in contact with the pick-up structure 510, and no position is provided on the substrate BS for the pick-up structure 510, and most of the substrate BS is in contact with the mold M directly. As such, the soft polymer layer 520' obtained through heating the soft polymer material 520 exists only in a position aligned with the pick-up structure 510 and does not extend along the surface of the substrate BS.

Based on the above, a micro pick-up array 700 of this embodiment has the pick-up structure 510. The pick-up structure 510 is formed through the photolithography process; hence, the pick-up structure 510 is less likely to be deformed during the manufacturing process. The alignment precision of picking up the micro devices by the micro pick-up array 700 is thereby enhanced. In addition, the micro pick-up array 700 may be made to be considerably small in size and thus the thickness of the soft polymer layer can be thinner. In this way, not only relatively more sophisticated micro devices can be picked up, considerable time for curing can also be saved.

In view of the foregoing, the micro pick-up array provided by the embodiments of the disclosure has the pick-up structure. The pick-up structure is formed through the photolithography process; hence, the pick-up structure is less likely to be deformed during the manufacturing process. The precision of picking up the micro device by the micro pick-up array is thereby enhanced. In addition, the micro pick-up array is formed through the photolithography process, the micro pick-up structure can thus be made to be considerably small in size and thus the thickness of the soft polymer layer can be thinner. In this way, not only relatively more sophisticated micro devices can be picked up, considerable time for curing can also be saved. In an embodiment, the micro pick-up structure has the recess, and the soft polymer layer fills into the recess, a process window is therefore increased when picking up the micro devices.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A micro pick-up array used to pick up a micro device, the micro pick-up array comprises:
   a substrate;
   a pick-up structure located on the substrate, the pick-up structure being composed of a photo sensitive material, wherein the pick-up structure has a recess; and
   a soft polymer layer covering the pick-up structure, wherein the soft polymer layer fills into the recess, wherein a thickness of the soft polymer layer aligned with the recess is between 10 μm and 50 μm.

2. The micro pick-up array of claim 1, wherein a material of the soft polymer layer comprises polydimethylsiloxane or rubber.

3. The micro pick-up array of claim 1, wherein a side surface of the pick-up structure is stair-shaped.

4. The micro pick-up array of claim 1, wherein the soft polymer layer fills up the recess.

5. The micro pick-up array of claim 1, wherein the recess in the pick-up structure penetrates through the pick-up structure, and the soft polymer layer fills into the recess and is in contact with the substrate.

6. The micro pick-up array of claim 1, wherein a width of the recess in the pick-up structure is between 5 μm and 100 μm.

7. The micro pick-up array of claim 1, wherein a depth of the recess in the pick-up structure is between 5 μm and 20 μm.

8. The micro pick-up array of claim 1, wherein the photo sensitive material is a transparent material.

9. A manufacturing method of a micro pick-up array, comprising:
   providing a substrate;
   forming a pick-up structure on the substrate, the pick-up structure being formed by a photolithography process, wherein the pick-up structure has a recess; and
   forming a soft polymer layer on the pick-up structure, wherein the soft polymer layer fills into the recess, wherein a thickness of the soft polymer layer aligned with the recess is between 10 μm and 50 μm.

10. The manufacturing method of the micro pick-up array of claim 9, wherein the method of forming the soft polymer layer on the pick-up structure comprises:
    forming a soft polymer material by a spin coating method or a printing method; and
    heating the soft polymer material such that the soft polymer material is cured into the soft polymer layer.

11. The manufacturing method of the micro pick-up array of claim 9, wherein the method of forming the soft polymer layer on the pick-up structure comprises:
    coating a soft polymer material onto a transfer substrate;
    using the pick-up structure to dip the soft polymer material on the transfer substrate; and
    heating the soft polymer material such that the soft polymer material is cured into the soft polymer layer.

12. The manufacturing method of the micro pick-up array of claim 9, wherein the method of forming the soft polymer layer on the pick-up structure comprises:
- forming a soft polymer material on the pick-up structure by a coating method;
- pressing the substrate with a mold, the mold comprising an opening aligned with the pick-up structure; and
- heating the soft polymer material such that the soft polymer material is cured into the soft polymer layer.

\* \* \* \* \*